(12) United States Patent
Müller et al.

(10) Patent No.: US 8,227,342 B2
(45) Date of Patent: Jul. 24, 2012

(54) METHOD OF FABRICATING A TRANSISTOR WITH SEMICONDUCTOR GATE COMBINED LOCALLY WITH A METAL

(75) Inventors: Markus Müller, Eindhoven (NL); Grógory Bidal, Grenoble (FR)

(73) Assignees: STMicroelectronics (Crolles 2) SAS, Crolles (FR); NXP B.V. (Dutch Corporation), Ag Eindhoven (NL)

( * ) Notice: Subject to any disclaimer, the term of this patent is extended or adjusted under 35 U.S.C. 154(b) by 277 days.

(21) Appl. No.: 12/521,802

(22) PCT Filed: Jan. 10, 2008

(86) PCT No.: PCT/EP2008/050260
§ 371 (c)(1),
(2), (4) Date: Dec. 21, 2009

(87) PCT Pub. No.: WO2008/084085
PCT Pub. Date: Jul. 17, 2008

(65) Prior Publication Data
US 2010/0102402 A1    Apr. 29, 2010

(30) Foreign Application Priority Data
Jan. 11, 2007  (EP) .................................... 07300721

(51) Int. Cl.
*H01L 21/8234*  (2006.01)
(52) U.S. Cl. ................. 438/655; 257/E21.621
(58) Field of Classification Search .................. 257/392, 257/E21.196, E21.205, E21.621, E29.152; 438/229, 230, 655
See application file for complete search history.

(56) References Cited

U.S. PATENT DOCUMENTS

| | | | |
|---|---|---|---|
| 5,753,546 A * | 5/1998 | Koh et al. | 438/229 |
| 5,977,591 A | 11/1999 | Fratin et al. | |
| 6,187,657 B1 | 2/2001 | Xiang et al. | |
| 6,281,086 B1 | 8/2001 | Wieczorek et al. | |

FOREIGN PATENT DOCUMENTS

| | | |
|---|---|---|
| JP | 3106072 A | 5/1991 |
| JP | 8340104 A | 12/1996 |
| JP | 2005228868 A | 8/2005 |
| WO | WO 2007068393 A | 6/2007 |

OTHER PUBLICATIONS

International Search Report dated Mar. 7, 2008, from corresponding International Application No. PCT/EP2008/050260.

* cited by examiner

*Primary Examiner* — Thomas L Dickey
(74) *Attorney, Agent, or Firm* — Wolf, Greenfield & Sacks, P.C.

(57) ABSTRACT

A method of forming a field effect transistor comprising a gate formed on an insulating layer, the gate having, in a zone in contact with the insulating layer, a semiconducting central zone and lateral zones in the length of the gate, the method comprising forming a gate comprising a portion of insulating layer, a portion of semiconducting layer formed over the insulating layer, and a portion of mask layer formed over the semiconducting layer; performing an etching of the portion of the mask layer such that only a portion in the center of the gate remains; and reacting the semiconducting gate with a metal deposited over the gate.

27 Claims, 3 Drawing Sheets

US 8,227,342 B2

METHOD OF FABRICATING A TRANSISTOR WITH SEMICONDUCTOR GATE COMBINED LOCALLY WITH A METAL

CROSS REFERENCE TO RELATED APPLICATIONS

This application claims the priority benefit of European patent application number 07300721.3, filed on Jan. 11, 2007, entitled "Method of Fabricating a Transistor With Semiconductor Gate Combined Locally with a Metal," which is hereby incorporated by reference to the maximum extent allowable by law.

BACKGROUND OF THE INVENTION

1. Field of the Invention

The present invention concerns, in general, the field of integrated circuits and more particularly a method of manufacturing a field effect transistor having an isolated gate, the gate formed of a semiconductor material combined locally with a metal. The present invention also concerns the transistor obtained by this method.

2. Background of the Invention

Generally, it is desired to manufacture integrated circuits having higher and higher densities and therefore transistors that are smaller and smaller. However, reducing the gate size of MOS transistors causes diverse parasitic effects. Among these effects, the short channel effect (SCE) and drain induced barrier lowering (DIBL) could be mentioned. The short channel effect is caused by the electrostatic influence of source and drain regions which are closest together when the gate length is reduced. The barrier lowering effect reduces the energy barrier for carriers (electrons and holes) in the channel while the MOS transistor is off, which increases leakage current. These two effects lower the threshold voltage ($V_T$) in the case of a MOS transistor having an N channel or increase the threshold voltage in the case of a MOS transistor having a P channel. To maintain a satisfactory threshold voltage $V_T$ when the gate length is reduced, it is therefore necessary to modify the structure of the MOS transistor to at least partially cancel the short channel effect and barrier lowering.

To avoid parasitic problems of short channel and barrier lowering, non-published European patent application N° 05/292650.8 filed 13 Dec. 2005 proposes a MOS transistor in which the gate is formed of a number of zones, as illustrated in FIG. 1. This MOS transistor is formed on a substrate 10. It comprises a gate G, a source S and a drain D. Spacers 14 are formed on each side of the gate G. The gate region G is isolated from the substrate 10 by a silicon oxide layer 16 referred to as the gate oxide. The gate G, positioned above the gate oxide layer 16, is composed of two zones. The first zone 18, positioned in the center of the gate length and close to the gate oxide 16, is of polycrystalline silicon. On each side of this polycrystalline silicon zone 18, and above it, the gate is silicided. The silicided zone 20, in contact with the gate oxide 16, allows a threshold voltage to be obtained which is higher on each side of the gate, lengthwise in the gate, while the threshold voltage corresponding to the polycrystalline silicon zone 18 situated in the center of the gate is lower. This increase in the threshold voltage on each side of the gate allows the reduction in the threshold voltage caused by the parasitic effects mentioned above to be cancelled at least partially.

The method proposed in this prior art for forming a gate comprising a silicided zone above and on each side of a polycrystalline silicon zone positioned in a central part of a gate is not easily controllable.

SUMMARY OF THE INVENTION

At least one embodiment of the present invention relates to field effect transistors having isolated gates, which will be referred to as MOS transistors herein, even if their gate is not formed of metal and their gate insulating layer is not necessarily formed of oxide.

An embodiment of the present invention aims at providing a new and improved method for forming a transistor having a semiconducting gate combined locally with a metal.

According to a first aspect of the present invention, there is provided a method of forming a field effect transistor comprising a gate formed on an insulating layer, the gate having, in a zone in contact with the insulating layer, a semiconducting central zone and lateral zones in the length of the gate, the method comprising forming a gate comprising a portion of insulating layer, a portion of semiconducting layer formed over the insulating layer, and a portion of mask layer formed over the semiconducting layer; performing an etching of the portion of the mask layer such that only a portion in the center of the gate remains; and reacting the semiconducting gate with a metal deposited over the gate.

According to an embodiment of the present invention, the semiconducting layer has a structure such that the reaction between the metal and the gate occurs principally heightwise.

According to an embodiment of the present invention, the semiconducting layer is formed of polycrystalline silicon.

According to an embodiment of the present invention, the reaction between the semiconducting layer and the metal layer is a silicidation.

According to an embodiment of the present invention, the etching of the portion of the mask layer removes the mask layer laterally lengthwise in the gate by a distance of less than half the length of the gate and removes vertically part of the mask layer According to an embodiment of the present invention, spacers are formed on each side of the gate.

According to an embodiment of the present invention, the mask layer is of a material that does not react during the reaction between the metal and the material of the gate and allowing it to be etched selectively from the material of the gate and the spacers, for example of silicon oxide.

According to an embodiment of the present invention, the metal is chosen from a group comprising nickel, cobalt and titanium.

According to a first aspect of the present invention, there is provided a field effect transistor comprising an isolated gate formed on a substrate, the gate comprising, lengthwise in the gate, a first semiconducting zone combined with a metal, a semiconducting central zone, and a second semiconducting zone combined with a metal.

According to an embodiment of the present invention, the combined metal of the first and second zones is chosen from a group comprising titanium, erbium, dysprosium, ytterbium, terbium, platinum, iridium, hafnium, chromium, molybdenum, palladium, tungsten, iron, cobalt, tantalum, rhodium, zirconium and manganese.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

As is normal in the representation of integrated circuits, the various figures are not drawn to scale.

DETAILED DESCRIPTION

Figure 1:
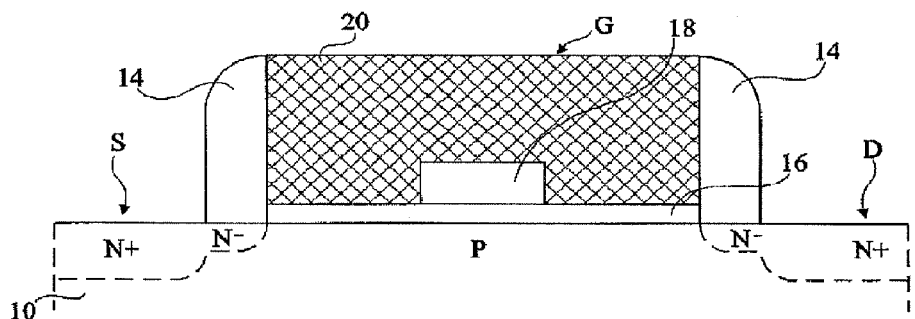
FIG. 1, described above, is a cross section view of a MOS transistor in which the gate comprises silicided portions.
Figure 2A:
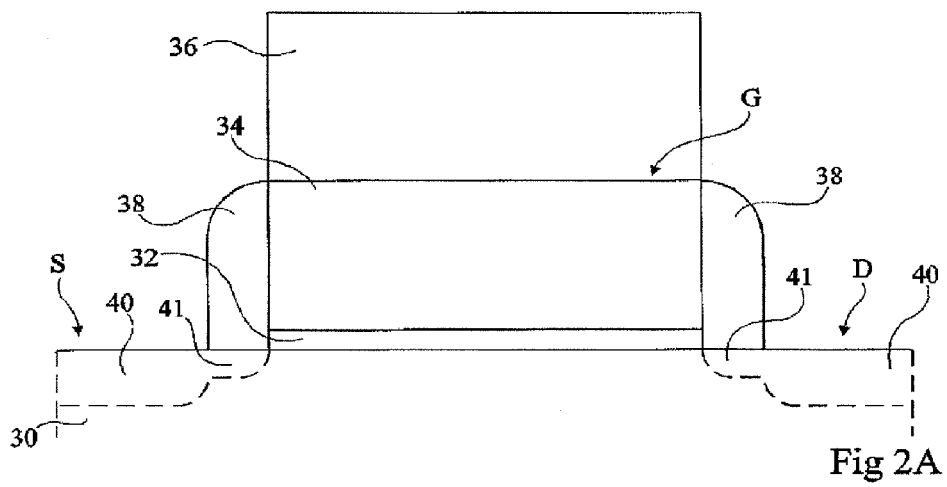
FIGS. 2A to 2E are cross section views illustrating successive steps in an example method of fabricating an isolated gate (MOS) field effect transistor having a semiconductor gate combined locally with a metal.

FIG. 2A illustrates an intermediate structure corresponding to the result of initial steps of an example method of fabricating a MOS transistor according to an embodiment of the invention.

A semiconductor substrate 30 has a stack formed on it comprising an oxide layer 32 (gate oxide), a polycrystalline silicon layer 34, and a mask layer 36. The mask layer 36 can be, for example, formed of silicon oxide ($SiO_2$). The various layers have been delimited by successive etching steps for forming a strip on the substrate 30, comprising a portion of the oxide layer 32, a portion of the polycrystalline silicon layer 34 and a portion of the mask layer 36. The polycrystalline silicon strip 34 forms the gate G of the MOS transistor. A first implantation of dopants is then performed on each side of the gate G for forming extended source S and drain D regions 41. Spacers 38 are then formed on each side of the strip 32, 34, 36. These spacers 38 can be, for example, formed of silicon nitride (SiN). Spacers 38 can be formed by depositing a silicon nitride layer over the whole device and performing an anisotropic etching of this layer so that it remains only on each side of the gate G. A second implantation of dopants is then performed to form source S and drain D regions 40 of the transistor.

Figure 2B:
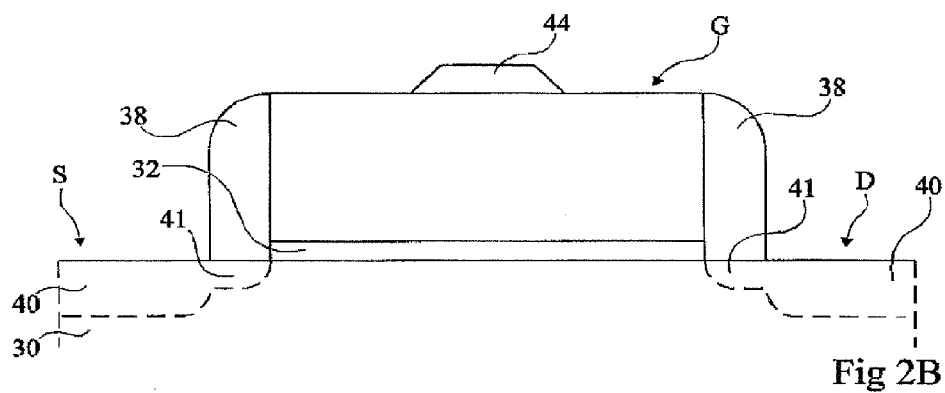

In the step of FIG. 2B, an isotropic etching process of the mask layer 36 is performed. This isotropic etching is selective in relation to spacers 38 and polycrystalline silicon layer 34. The isotropic etch removes the mask layer 36 horizontally and vertically. The etching is performed to remove laterally, by a chosen amount, layer 36 such that only a zone 44 remains in the center of the gate above the polycrystalline silicon layer 34. Zone 44, for example, has a substantially trapezoidal form. Zone 44 will be referred to as a "mask" in the following description. In order that the mask layer 36 is not completely etched and that the resulting mask 44 is of the desired length, the initial thickness of the mask layer 36 is preferably greater than the depth of the etch that is desired to be performed. The isotropic etch allows auto-alignment of mask 44 in the center of the polycrystalline silicon layer 34 of the gate G.

It will be understood that the invention can be applied to transistors having a very short gate length, for example less than 200 nm. By way of example, for a gate having a gate length of 140 nm, and if it is desired to obtain a mask 44 having a length of 40 nm, the masking layer 36 would preferably have a thickness greater than 60 nm.

Figure 2C:
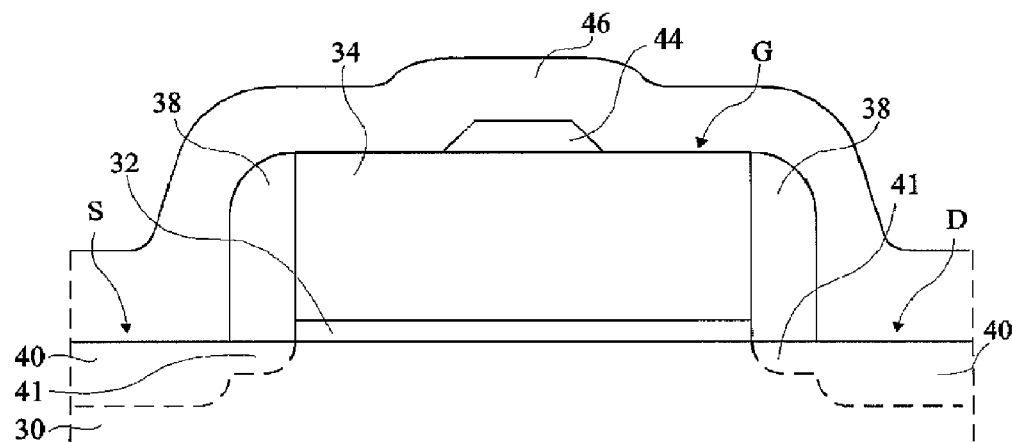

In the step of FIG. 2C, a metal layer 46 is deposited over the whole structure of FIG. 2B. The metal of layer 46 is a metal allowing a silicidation reaction with the polycrystalline silicon layer 34, this reaction preferably involving the diffusion of metal in the polycrystalline silicon layer 34. This metal is, for example, nickel.

Figure 2D:
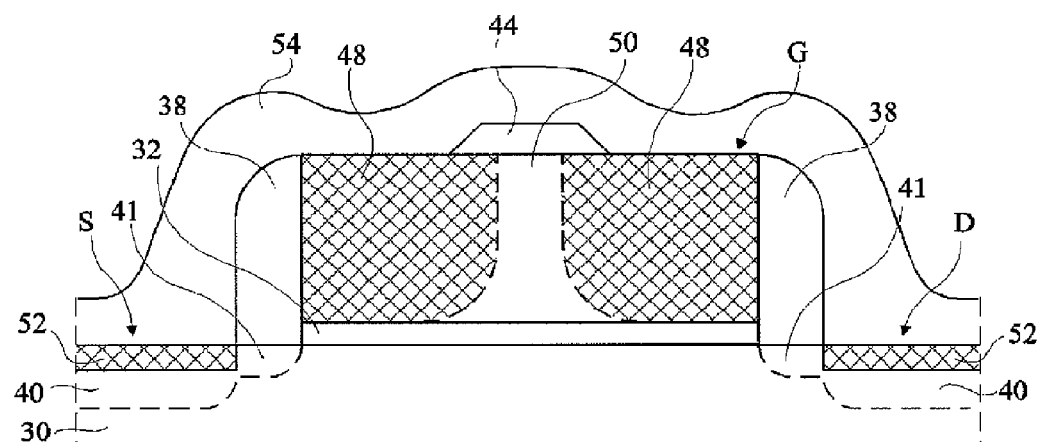

In the step of FIG. 2D, a silicidation reaction occurs between the metal of layer 46 and the polycrystalline silicon of the gate 34. A silicidation reaction also occurs between the metal of layer 46 and the source S and drain D of the transistor.

The silicidation reaction forms, in the polycrystalline silicon layer 34, silicided zones 48 on each side of the gate G. The central part 50 of the polycrystalline silicon layer 34 is not silicided because it is protected by the mask 44. To avoid a silicidation of the central part 50, a particular structure, for example a columnar structure, of the polycrystalline silicon of the gate could be provided. In the polycrystalline silicon columnar structure, the silicon grains are arranged extending height-wise in the gate G. This particular polycrystalline silicon structure can, for example, be obtained by an LPCVD process (Low-Pressure Chemical Vapor Deposition) with appropriate temperature and pressure of the deposition being chosen. The grains being drawn out height-wise in the gate, the metal diffuses more easily height-wise than lengthwise and depth-wise in the gate. Furthermore, at the same time, a silicidation reaction occurs between the metal of layer 46 and the source S and drain D regions, thus forming silicided zones 52 over the source and drain. Contrarily to what is illustrated in FIG. 2D, which is not drawn to scale, the silicided zones of the source S and drain D regions, for example, have a depth approximately equal to the depth of the silicided zones of the gate G. Once the silicidization reaction has occurred, there remains, over the whole device, a metal layer 54 of metal which has not reacted.

Figure 2E:
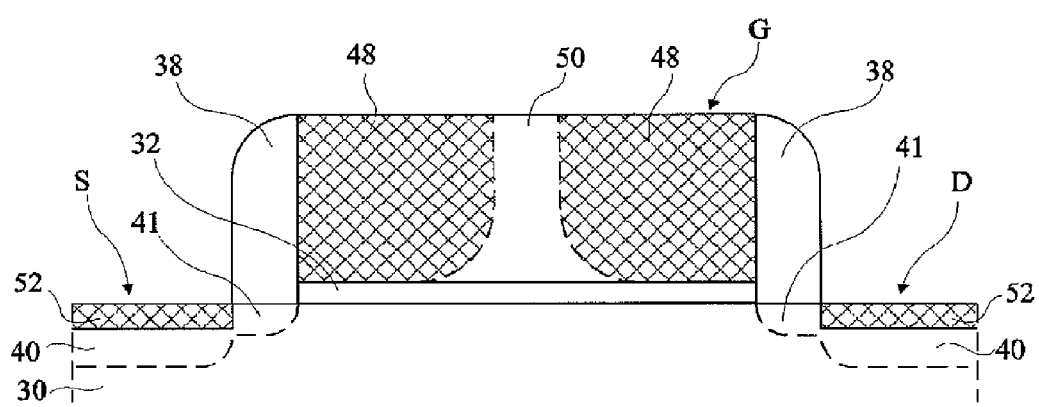

In the step of FIG. 2E, the remaining metal 54 and mask 44 have been removed by successive selective etches. Next, in a known manner, insulating layers and interconnecting conducting layers are deposited for connecting the gate G, source S and drain D regions of the structure to other elements of the integrated circuit in which the transistor is formed.

Figure 3:
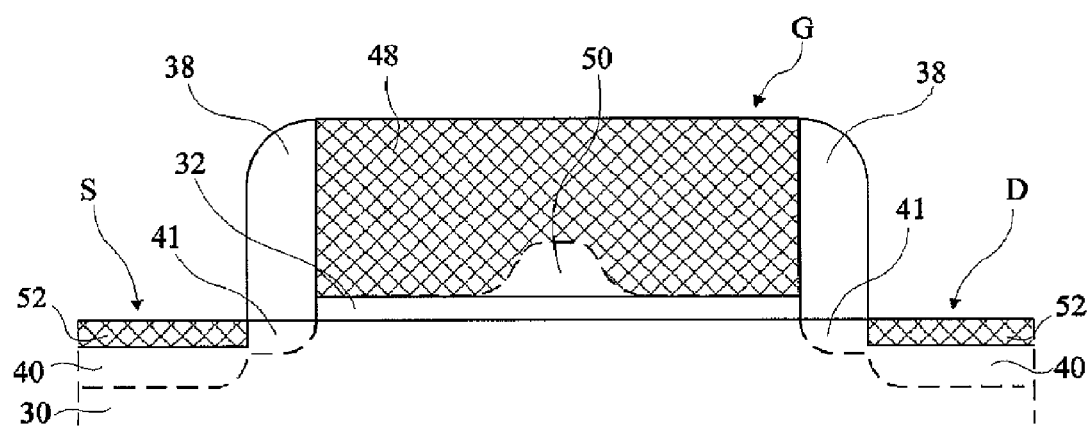
FIG. 3 illustrates another transistor structure obtained by a method according to an embodiment of the present invention.

FIG. 3 illustrates a variation of the structure obtained by a fabrication method according to an embodiment of the invention. The principal difference between FIG. 3 and FIG. 2E is that, in FIG. 3, the two lateral silicided zones 48 of FIG. 2E are joined together in the top of the gate. The man skilled in the art will understand that to obtain the structure of FIG. 3, certain parameters of the method steps of FIG. 2A to 2D are modified, for example the duration of diffusion, the dimensions of the mask, and/or the characteristics of the polycrystalline silicon of the gate.

As explained above, the MOS transistor structure described herein is not limited to a metal-oxide-semiconductor structure. Numerous variations can be envisaged, for example concerning the material of the gate G, the metal of layer 46, the material of the gate isolation 32, the material of the mask layer 36 and the method of obtaining the auto-aligned mask 44.

The gate layer 34 could be formed of any semiconductor material that can be combined with a metal in a silicidation or germanization reaction. In particular, layer 34 could be formed of silicon, of germanium or of silicon germanium, and the semiconductor material could be in various forms, for example monocrystalline, polycrystalline or amorphorous.

The metal layer 46 could be in any metal allowing a silicidation or germanization reaction with the semiconductor material of the gate layer 34. Metal layer 46 is preferably formed of a metal of the group comprising titanium, erbium, dysprosium, ytterbium, terbium, platinum, iridium, hafnium, chromium, molybdenum, palladium, tungsten, iron, cobalt, tantalum, rhodium, zirconium and manganese. The metal of the layer 46 is such that, during silicidation or germanization, the dominant reaction is that of a metal diffusion towards the gate layer 34, and not the inverse. The method of forming the silicided or germanided zones can be adapted based on the metal used (temperature, reaction time . . . ).

The insulating layer 32 of the gate can be formed in any type of insulator, for example in silicon nitride ($Si_3N_4$), in oxide ($HfO_2$ . . . ), in any material having a high permittivity (high-K) ($Al_2O_3$, $Y_2O_3$, $La_2O_3$, $Ta_2O_5$, $TiO_2$, $HfO_2$, $ZrO_2$, $BaTiO_3$, $BaZrO_3$, $ZrSiO_4$, $HfZrO_2$ . . . ) or in all other insulating materials that do not react during the reaction that forms the silicide or germanicide.

The mask layer 36 can be of silicon oxide ($SiO_2$), an oxynitride $SiO_xN_y$, a silicon nitride $Si_3N_4$, or a structure having two layers, for example a nitride over an oxide. The mask layer can also be of any other material not reacting during the silicidation and being etchable selectively from the materials constituting layer 34 and spacers 38.

In the embodiments described, the etching of the mask layer 36 performed between the steps of FIGS. 2A and 2B is an isotropic etch. Depending on the materials used for forming mask layer or layers 36, and the properties of these materials (etching speed horizontally and vertically), anisotropic and isotropic etching steps can be combined to obtain a mask 44 of the form and size required.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A method of forming a field effect transistor comprising a gate formed on an insulating layer, the gate having, in a zone in contact with the insulating layer, a semiconducting central zone and lateral zones in the length of the gate, the method comprising:
   forming an insulating layer and a semiconducting layer over the insulating layer;
   performing an etching of the insulating layer and the semiconducting layer to define a portion of the insulating layer and a portion of the semiconducting layer;
   following the etching, forming a gate comprising the portion of insulating layer, the portion of semiconducting layer formed over the insulating layer, and a mask layer formed over the semiconducting layer;
   performing an etching of the mask layer such that only a portion of the mask layer in the center of the gate remains; and
   reacting the portion of the semiconducting layer of the gate with a metal deposited over the gate.

2. The method of claim 1, wherein the semiconducting layer has a structure such that the reaction between the metal and the portion of the semiconducting layer occurs principally height-wise.

3. The method of claim 2, wherein the semiconducting layer is formed of polycrystalline silicon.

4. The method of claim 3, wherein the reaction between the portion of semiconducting layer and the metal layer is a silicidation.

5. The method of claim 1, wherein the etching of the mask layer removes the mask layer laterally lengthwise in the gate by a distance of less than half the length of the gate and removes vertically part of the mask layer.

6. The method of claim 1, wherein spacers are formed on each side of the gate.

7. The method of claim 1, wherein the mask layer is of a material that does not react during the reaction between the metal and the material of the gate and allows the mask layer to be etched selectively from the material of the gate and the spacers.

8. The method of claim 1, wherein the metal is chosen from a group comprising nickel, cobalt and titanium.

9. A method comprising:
   forming a gate region for a field effect transistor, the gate region comprising an insulating region and a semiconducting region formed on the insulating region;
   forming, on a surface of the semiconducting region, a mask that extends over a portion of the semiconducting region, the portion of the semiconducting region being in a center of the gate region, the portion being less than all of the semiconducting region;
   forming a metal layer on the surface of the semiconducting region and on a surface of the mask that extends over a portion of the semiconducting region; and
   reacting the metal layer with the semiconducting region to form at least one silicide region within the semiconducting region.

10. The method of claim 9, wherein forming the mask that extends over the portion of the semiconducting region comprises forming a second insulating region that extends over the portion of the semiconducting region.

11. The method of claim 9, wherein:
   reacting the metal layer with the semiconducting region to form the at least one silicide region comprises transforming a first part of the semiconducting region to the at least one silicide region, and
   following the reacting, a second part of the semiconducting region different from the first part remains a semiconducting region and is not a silicide region.

12. The method of claim 11, wherein the second part of the semiconducting region corresponds to the portion of the semiconducting region over which the mask extends.

13. The method of claim 11, wherein forming the semiconducting region of the gate region comprises forming the second part of the semiconducting region with semiconductor grains extending in a height-wise direction in the semiconducting region, the height-wise direction being a direction in which the insulating region, the semiconducting region, and the mask are formed in order.

14. The method of claim 11, wherein forming the semiconducting region of the gate region comprises forming the second part of the semiconducting region as a columnar structure.

15. The method of claim 11, wherein forming the semiconducting region of the gate region comprises forming the semiconducting region as a columnar structure.

16. The method of claim 11, wherein the second part extends in the semiconducting region between the insulating layer and the mask.

17. The method of claim 9, wherein:
   the method further comprises forming a source region for the field effect transistor,
   forming the metal layer on the surface of the gate region comprises forming the metal layer on a surface of the source region, and
   reacting the metal layer with the semiconducting region further comprises reacting the metal layer with the source region to for at least one second silicide region within the source region.

18. The method of claim 17, wherein:
the method further comprises forming a spacer on a side of the gate region, the spacer extending over a portion of the source region, and
reacting the metal layer with the source region to form the at least one second silicide region comprises transforming a first part of the source region to the at least one second silicide region, and
following the reacting, a second part of the source region different from the first part is not a silicide region, the second part corresponding to the portion of the source region over which the spacer extends.

19. The method of claim 17, wherein a thickness of the at least one second silicide region within the source region matches a thickness of the at least one silicide region within the semiconducting region.

20. The method of claim 17, wherein:
the method further comprises forming a drain region for the field effect transistor,
forming the metal layer on the surface of the gate region comprises forming the metal layer over a surface of the drain region, and
reacting the metal layer with the semiconducting region further comprises reacting the metal layer with the drain region to form at least one third silicide region within the drain region.

21. The method of claim 9, wherein forming the mask, in the center of the gate region, extending over the portion of the semiconducting region comprises forming the mask extending over a portion of the semiconducting region that does not include an edge of the semiconducting region.

22. A method comprising:
forming on a semiconductor substrate a gate and a source of a field effect transistor, the gate comprising a first semiconducting region and the source comprising a second semiconducting region;
forming, on a top surface of the first semiconducting region, a mask that extends over a portion of the top surface of the first semiconducting region, the portion of the top surface of the first semiconducting region not including an edge of the top surface of the first semiconducting region;
forming a metal layer that extends over the gate and over the source, the metal layer contacting the top surface of the first semiconducting region, contacting the mask, and contacting a top surface of the second semiconducting region of the source region; and
reacting the metal layer with the first semiconducting region and the second semiconducting region to form at least one first silicide region within the first semiconducting region and at least one second silicide region within the second semiconducting region.

23. The method of claim 22, wherein:
reacting the metal layer with the first semiconducting region to form the at least one first silicide region comprises transforming a first part of the first semiconducting region to the at least one silicide region; and
following the reacting, a second part of the first semiconducting region different from the first part remains a semiconducting region and is not a silicide region.

24. The method of claim 22, wherein the second part of the first semiconducting region corresponds to the portion of the top surface of the first semiconducting region over which the mask extends.

25. The method of claim 22, wherein forming the first semiconducting region of the gate comprises forming the second part of the first semiconducting region with semiconductor grains extending in a height-wise direction in the first semiconducting region, the top surface of the first semiconducting region being an upper surface of the first semiconducting region in the height-wise direction.

26. The method of claim 22, wherein:
the method further comprises forming a spacer on a side of the gate, the spacer extending over a portion of the second semiconducting region of the source, and
reacting the metal layer with the second semiconducting region to form the at least one second silicide region comprises transforming a first part of the second semiconducting region to the at least one second silicide region, and
following the reacting, a second part of the second semiconducting region different from the first part remains a semiconducting region and is not a silicide region, the second part corresponding to the portion of the second semiconducting region over which the spacer extends.

27. The method of claim 22, wherein:
the method further comprises forming a drain of the field effect transistor, the drain comprising a third semiconducting region;
forming the metal layer further comprises forming the metal layer extending over the drain, the metal layer contacting a top surface of the third semiconducting region; and
reacting the metal layer further comprises reacting the metal layer with the third semiconducting region to form at least one third silicide region within the third semiconducting region.

* * * * *